(12) United States Patent
Heineman et al.

(10) Patent No.: US 11,917,378 B2
(45) Date of Patent: Feb. 27, 2024

(54) SYSTEMS AND METHODS FOR CONTROLLING POWERSTAGE SUPPLY MODULATION VIA AUDIO INTERFACE

(71) Applicant: Maxim Integrated Products, Inc., San Jose, CA (US)

(72) Inventors: Douglas Heineman, Austin, TX (US); Feng Yu, Sunnyvale, CA (US); Siwas Chandhrasri, San Jose, CA (US); Kevin Bryan LaVoie, Campbell, CA (US); Brian Gregory Rush, Southlake, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 142 days.

(21) Appl. No.: 17/712,815

(22) Filed: Apr. 4, 2022

(65) Prior Publication Data
US 2022/0408182 A1    Dec. 22, 2022

Related U.S. Application Data

(60) Provisional application No. 63/212,092, filed on Jun. 17, 2021.

(51) Int. Cl.
*H04R 3/00*    (2006.01)
*H03F 3/183*    (2006.01)
*H04R 29/00*    (2006.01)

(52) U.S. Cl.
CPC .............. *H04R 3/00* (2013.01); *H03F 3/183* (2013.01); *H04R 29/001* (2013.01)

(58) Field of Classification Search
CPC .......... H04R 3/00; H04R 29/001; H03F 3/183
See application file for complete search history.

(56) References Cited

U.S. PATENT DOCUMENTS

| | | | |
|---|---|---|---|
| 9,722,544 B2 * | 8/2017 | Olson | ........................ H03F 3/68 |
| 2007/0178860 A1 | 8/2007 | Sutardja | |
| 2017/0346446 A1 | 11/2017 | May et al. | |
| 2018/0034416 A1 | 2/2018 | Duncan et al. | |

FOREIGN PATENT DOCUMENTS

WO    WO-2007143843 A1 *  12/2007    ............... H03F 1/02

* cited by examiner

*Primary Examiner* — Andrew L Sniezek
(74) *Attorney, Agent, or Firm* — North Weber & Baugh LLP; Michael North (57) ABSTRACT

Systems and methods increase power efficiency in communication systems by examining a digital signal to determine whether a threshold corresponding to an increase in a power requirement is likely to be exceeded. The signal is encoded with information indicating the likely change and communicated to a driver that, upon extracting the information, uses it to cause instruct an amplifier to increase a power output to accommodate the increase in power requirement. Once the threshold is no longer exceeded, the driver circuit, advantageously, decreases the power output to conserve energy. In various embodiments, an amplifier may increase power efficiency by switching from a low-power circuit configuration to a high-circuit configuration.

20 Claims, 12 Drawing Sheets

SYSTEMS AND METHODS FOR CONTROLLING POWERSTAGE SUPPLY MODULATION VIA AUDIO INTERFACE

CROSS REFERENCE TO RELATED PATENT APPLICATIONS

The present application claims priority benefit, under 35 U.S.C. § 119(e), and commonly-assigned U.S. provisional patent application No. 63/212,092, filed on Jun. 17, 2021, entitled "SYSTEMS AND METHODS FOR CONTROLLING POWERSTAGE SUPPLY MODULATION VIA AUDIO INTERFACE", listing as inventors Douglas Heineman, Feng Yu, Siwas Chandhrasri, and Kevin Bryan LaVoie, which application is herein incorporated by reference as to its entire content. Each reference mentioned in this patent document is incorporated by reference herein in its entirety.

BACKGROUND

A. Technical Field

The present disclosure relates generally to signal processing. More particularly, the present disclosure relates to systems and methods for driving signals in signal amplifier architectures, such as audio circuits, e.g., to efficiently drive speakers in sound systems via an audio interface.

B. Background

Signal processing applications are striving to increase the time between battery supply recharging events. An increasingly common method to reduce power consumption and extend battery life is to increase the efficiency of system, e.g., an audio system that uses a loudspeaker driver powers a set of speakers. However, efficiency considerations have to take into account that a power supply needs sufficient headroom or margin, e.g., to recover an audio component of a signal at an amplifier or speaker, ideally, without signal integrity issues or other audible interference, such as clipping, which creates distortion and loss of fidelity. Efficiency considerations dictate that, depending on signal threshold levels, switching or transitioning either between two or more power supplies or different features of the same power supply be performed to increase efficiency. However, existing designs are typically either reliable but costly or low-cost but less reliable, thus, requiring higher safety margins. Accordingly, what is needed are reliable low-cost systems and methods that allow for high-speed and timing-accurate mode transitions that improve efficiency.

BRIEF DESCRIPTION OF THE DRAWINGS

References will be made to embodiments of the disclosure, examples of which may be illustrated in the accompanying figures. These figures are intended to be illustrative, not limiting. Although the accompanying disclosure is generally described in the context of audio applications, it should be understood that it is not intended to limit the scope of the disclosure. One skilled in the art will recognize that the teachings of the present disclosure may equally be applied to non-audio systems, including network communications, e.g., in antenna networks, and other signal processing applications. Items in the figures may be not to scale.

DETAILED DESCRIPTION OF EMBODIMENTS

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system/device, or a method on a tangible computer-readable medium.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," and "comprising" shall be understood to be open terms and any lists the follow are examples and not meant to be limited to the listed items.

A service, function, or resource is not limited to a single service, function, or resource; usage of these terms may refer to a grouping of related services, functions, or resources, which may be distributed or aggregated. The use of memory, database, information base, data store, tables, hardware, and the like may be used herein to refer to system component or components into which information may be entered or otherwise recorded. The terms "data," "information," along with similar terms may be replaced by other terminologies referring to a group of bits, and may be used interchangeably. Any headings used herein are for organizational purposes only and shall not be used to limit the scope of the description or the claims. All documents cited herein are incorporated by reference herein in their entirety.

In this document, the terms "data" and "data signal" may be used interchangeably. The term "converter" refers to any electrical converter known in the art, including voltage regulators, such as boost regulators, buck regulators, and the like. "Low power supply" refers to low voltage supplies used for low output amplifier power, and "high power supply" refers to high voltage supplies used for high output amplifier power.

It is noted that although embodiments described herein are given in the context of off-chip architectures, one skilled in the art will recognize that the teachings of the present disclosure are so not limited and may equally be applied to on-chip applications.

Figure 1:
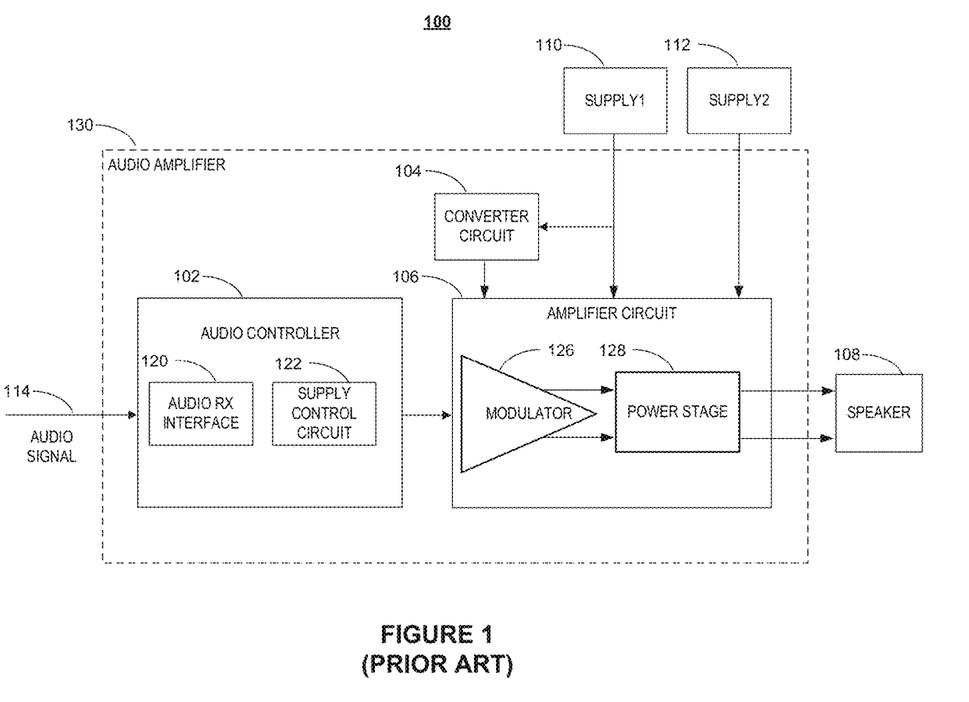
FIG. 1 is a block diagram of an exemplary power supply control circuit for an audio amplifier device.

FIG. 1 is a block diagram of an exemplary power supply control circuit for an audio amplifier system. Audio amplifier system 100 contains audio controller 102, converter circuit 104, amplifier circuit 106, power supply 110, 112, and speaker 108. As depicted, audio controller 102 is in the amplifier path of audio amplifier device 130 and contains audio receiver interface 120 and supply control circuit 122; and amplifier circuit 106 contains modulator 126 and power stage 128. Amplifier circuit 106 can contain various auxiliary components, such as ADCs, DACs, control logic, and so on. Power supply 110, 112 may be a battery, and converter circuit 104 is, for example, a boost converter that delivers a constant output power over a range of battery supply voltages.

It is noted that the figures in this document are simplified drawings intended to increase clarity. A person of skill in the art will understand that, for example, amplifier circuit 106 can have differential inputs that may be generated by a DAC. Amplifier circuit 106 in FIG. 1 can contain a Class-D amplifier that may have been selected for its higher efficiency than, e.g., a Class-AB amplifier. The higher efficiency is made possible by switching operations performed in power stage 128 of amplifier circuit 106.

In operation, audio amplifier device 130 uses audio controller 102 to perform power supply switching by, first, sensing audio signal 114, e.g., a pulse-code modulation (PCM) signal, or some other signal at speaker 108. An exemplary signal is presented in FIG. 2.

Figure 2:
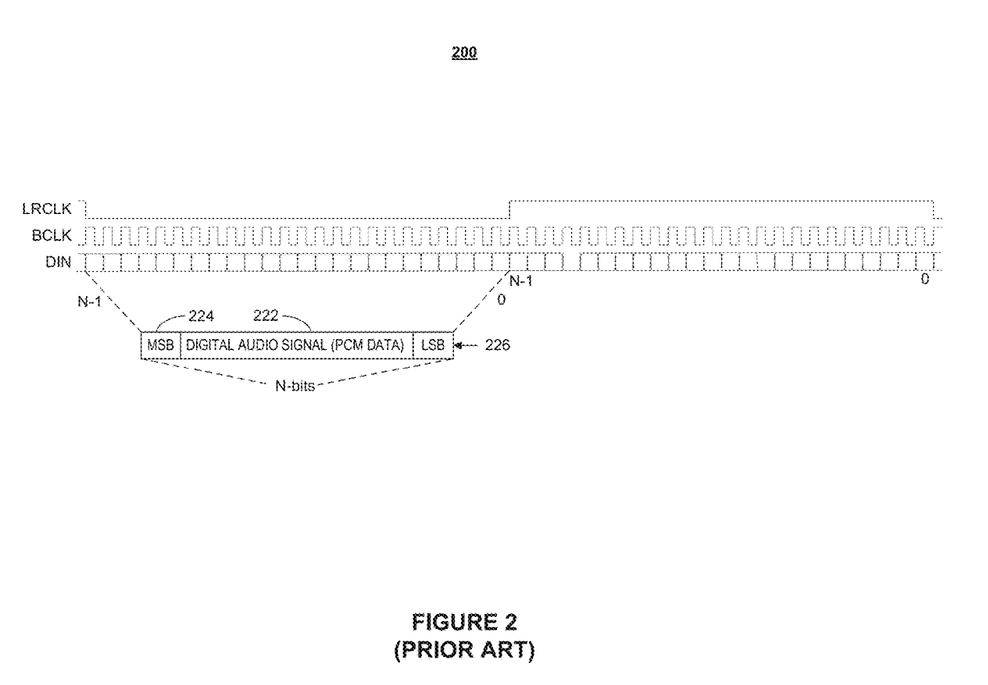
FIG. 2 shows a timing diagram for a standard audio interface format.

FIG. 2 shows a timing diagram for a standard I²S interface format commonly used in audio applications where the data format is between 16-bit to 32-bit, though the actual bit width could be larger or smaller depending on the use case. Digital audio signal 222 has an N-bit PCM signal that contains a most-significant bit 224 and a least-significant bit 226. Digital audio signal 222 may be decoded by an audio amplifier to determine whether the audio signal exceeds (or drops below), e.g., for a certain period of time, a certain threshold. In embodiments, this may be used as an indicator to switch from one power supply to another, or from one power supply configuration to another, e.g., to satisfy a margin requirement.

It is understood that although signal 222 in FIG. 2 comprises a digital audio signal, a person of skill in the art will appreciate that any other type and format of data may be encoded, including non-PCM data. As an example, a non-audio application may comprise an RF signal having some arbitrary format and whose content may be inspected, encoded and decoded, in accordance with embodiments presented herein, e.g., to determine whether the one or more characteristics of the RF signal exceeds or falls below some threshold.

Figure 3:
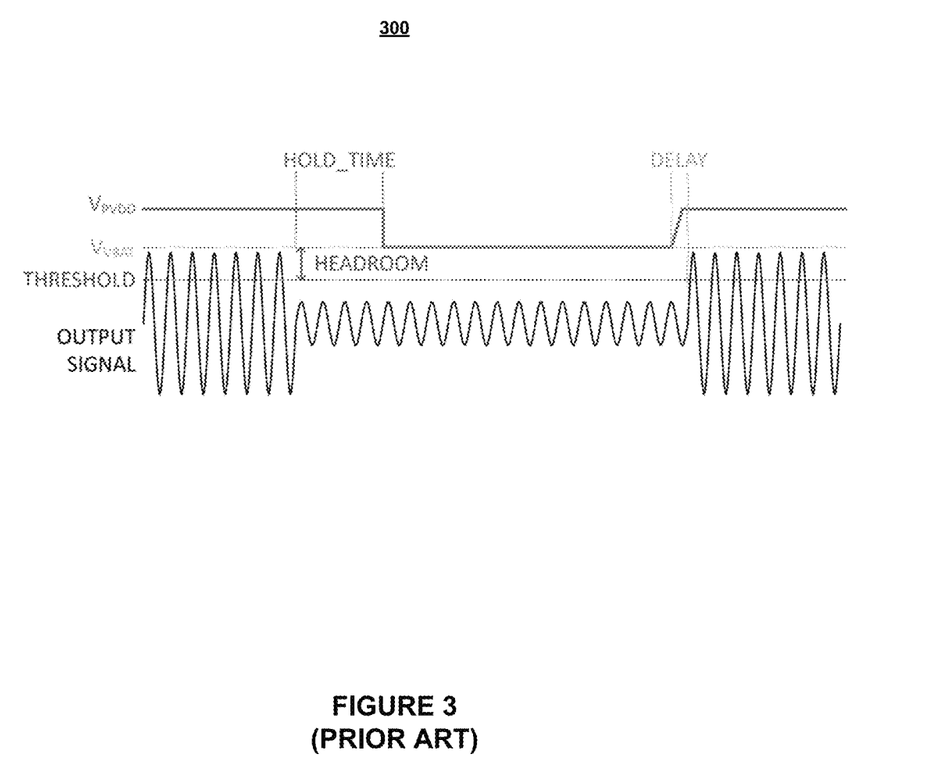
FIG. 3 shows how a control circuit algorithm may be applied to an audio signal to control an audio power supply.

FIG. 3 shows how a control circuit algorithm may be applied to an audio signal to control an audio power supply, including using a delay time, e.g., to reduce an inrush current and potential clipping when a boost circuit turns on. Other control circuits operating on other signals may achieve comparable results.

Returning to FIG. 1, audio amplifier device 130 can use power supply 110, 112 and converter circuit 104 to generate two or more different supply voltages to drive speaker 108. Power supply 112 is configured to provide one predetermined output voltage, and power supply 112, in combination with converter circuit 104 is configured to provide another output voltage.

In some existing designs, a multi-stage power supply having different gain settings can be used to drive speaker 108 with any number of voltages. Designs that use software and standalone digital interfaces to control and switch power supplies 110, 112 in the control plane require a communication to amplifier circuit 106. As an example, "boost bypass" mode transitions are therefore internal to a chip, i.e., they are tightly coupled with audio amplifier 130 itself.

As illustrated in FIG. 1, circuits and algorithms that control power stage 128 supply schemes are thus generally co-located on a same device, here, audio amplifier device 130. Accordingly, traditional designs require a relatively large amount of buffering to allow for sufficient time between transitions in order to safely switch from one power supply configuration to another, i.e., without risking unwanted degradation in audio performance, such as total harmonic distortion (THD) or low signal-to-noise ratio (SNR).

Some off-chip approaches have easier to re-program algorithms but require more precise methods of controlling the supply switchover process. Typically, communication is implemented either over a single-bit GPIO connection. However, this is very costly in terms of PCB routing and required pins on a host processor. Alternatively, control words are sent over a control interface such as I²C, which is a rather unreliable in terms of timing because the (low-bandwidth) control bus can be tied up with other critical communication at a moment that calls for a power supply switchover. Therefore, traditional designs require a relatively high margin that must be built in to ensure satisfactory operation. Accordingly, it is desirable to have systems and methods that overcome the shortcomings of existing designs.

Figure 4:
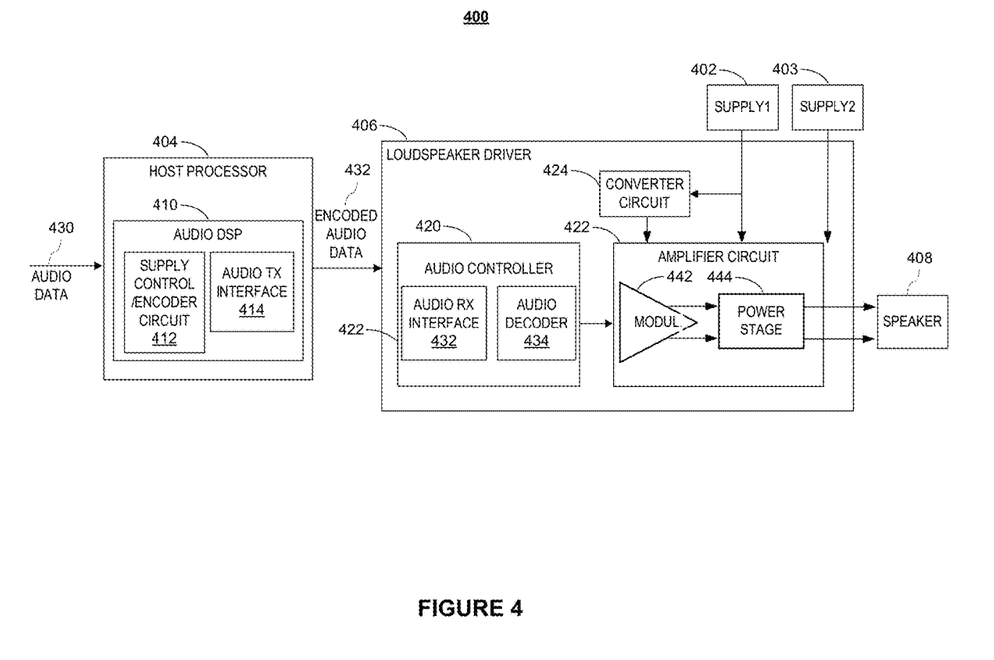
FIG. 4 illustrates a dynamic power supply transition system according to various embodiments of the present disclosure.

FIG. 4 illustrates a dynamic power supply transition system according to various embodiments of the present disclosure. In embodiments, system 400 may comprise power supplies 402, 403, host processor 404, loudspeaker driver 406, and speaker 408. As depicted, host processor 404, which may be a third-party device, may comprise audio signal processor (here implemented as audio DSP 410), which, in turn, may comprise supply control or encoder circuit 412 and audio transmit interface 414.

Similarly, loudspeaker driver 406 may comprise audio controller 420 that, in turn, may comprise audio decoder 434 and audio receiver interface 432, and amplifier circuit 422 may comprise modulator 442 and output power stage 444. Loudspeaker driver 406 may further comprise converter circuit 424 and amplifier circuit 422, which is designed to drive speaker 408.

It is understood that the teachings of the present disclosure may be applied to any type of audio amplifier, including class-G and class-H modes, i.e., to switch or transition between power supplies using different supplies at different times and, respectively, using the same supply with different variations allows to choose, e.g., between two or more voltage levels of the same power supply. Audio data 430 may be any audio content, such as a continuous audio signal or data stream generated by any audio source or device known in the art.

In embodiments, audio transmit interface 414 may be any existing digital audio interface, such as a I²S, TDM, SoundWire, or any other interface that may be used to transmit audio content to audio controller 420. Advantageously, I²S and SoundWire allow for deterministic communication in embodiments where power supply switchover control is communicated using audio data 430. In operation, audio transmit interface 414 in host processor 404 may be used to facilitate power supply switchover, as discussed in greater detail next.

In embodiments, audio signal processor 410 in host processor 404 may use audio signal 430 to estimate or calculate whether an output voltage of amplifier circuit 422 is likely to exceed a predetermined threshold. Audio signal processor 410 may apply to audio signal 430 any threshold detection scheme known in the art, such as the scheme illustrated in FIG. 3, to make a suitable likelihood determination or calculation that may comprise the use of statistical tools and calculated and/or measured data. In embodiments, encoder circuit 412 in audio DSP 410 may use a process to encode into audio data 430 control information to generate encoded audio data 432, which comprises information that indicates that at least some audio signal will exceed the predetermined threshold.

Once encoded audio data 432 has been generated, in embodiments, host processor 404 may use transmit interface 414 to communicate encoded audio data 432 to audio amplifier driver 406. In embodiments, amplifier driver 406, upon receiving encoded audio data 432 at interface 432 of audio controller 420, may use audio decoder 434 to extract the control information and apply a switchover process to amplifier circuit 422 to perform a supply selection between supplies 402, 403, or between various power supply configurations of one of respective supplies 402 and 403. As an example, the control information extracted from, e.g., PCM data may be based on information communicated within audio data 430 whose content, e.g., signal amplitude or frequency information, may be used by audio controller 420 to define a minimum power required to displace a speaker coil to produce a sound having a proper pitch and volume. This information may then be used to communicate to amplifier circuit 422 whether and when to commence a switchover process between power supplies 402, 403 and/or voltage levels that, ideally, satisfy both audio performance and energy consumption metrics.

In embodiments, the switchover process may comprise audio controller 420 anticipating, e.g., based on a relatively large buffer, that an audio threshold will be exceeded, and controlling amplifier circuit 422 to select a particular power supply configuration that reduces power consumption, for example, until audio controller 420 determines that the threshold will no longer be exceeded.

It is noted that any of supplies 402 and 403, e.g., each driving a speaker, may comprise a battery, and converter circuit 424 may comprise a boost converter that may be programmed automatically turn off once the battery is sufficiently charged to be able to directly supply amplifier circuit 422, further reducing power consumption.

Figure 5:
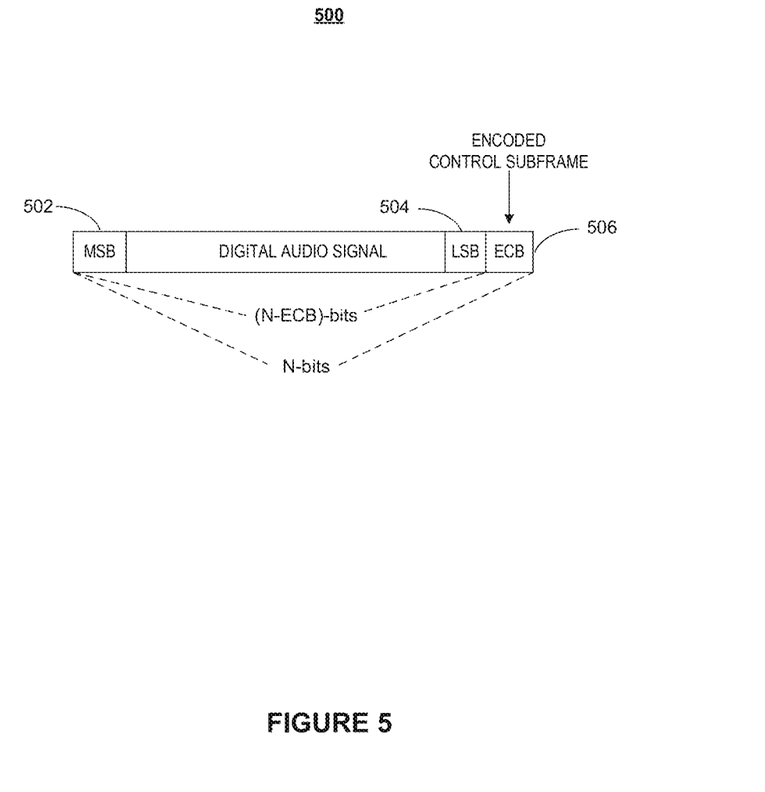
FIG. 5 illustrates an exemplary digital audio signal that comprises encrypted control information that is transmitted over an audio interface according to various embodiments of the present disclosure.

FIG. 5 illustrates an exemplary digital audio signal that comprises encrypted control information that may be transmitted over an audio interface according to various embodiments of the present disclosure. As depicted, encoded digital signal 500 is an N-bit signal, where N may be, e.g., 24. Signal 500 comprises a portion 502-504 for holding an audio component and an encoded subframe 506 that may be a dedicated for carrying at least one encoded control bit (ECB).

In embodiments, subframe 506 in digital audio signal 500 may be obtained, e.g., by truncating the last bit or bits of the N-bit audio signal 500 to obtain a portion 502-504 that has a length of N minus ECB bits and using subframe 506 as a control bit(s) to determine which power supply to use, while maintaining the remaining bits as audio signals. It is understood that, in embodiments, subframe 506 may comprise two or more bits, e.g., if two or three power supplies are to be controlled.

In other words, the control information that may be used for controlling a power supply switchover may be encoded into digital audio signal 500 in one or more ECB s depending on how many switchover levels or power supplies exist in an audio system. As an example, to activate or turn on a boost supply, a single-bit ECB may be set to one and, otherwise, it may be set to zero. Accordingly, unlike most-significant bit (MSB) 502, least-significant bit (LSB) 504 may change in position within digital signal 500, depending on the number of control bits that are used for encoding in subframe 506.

As person of skill in the art will appreciate, although reducing the available bits for the audio portion of signal 500, by scarifying one or more bits in digital audio signal 500, may degrade the SNR of the audio signal, in the audible effects on signal fidelity are negligible. As an example, encoding only one of, e.g., 24-bits in digital audio signal 500 for control purposes still allows for a high quality 23-bit audio signal (less than −138 dB, or −132 dB for 22-bits and two encoding bits used for control).

Advantageously, communicating encoded audio signal 500 between audio interfaces to facilitate a switchover process requires no PCB routing and no additional I/O pins on any device and saves area at no added cost.

Figure 6A:
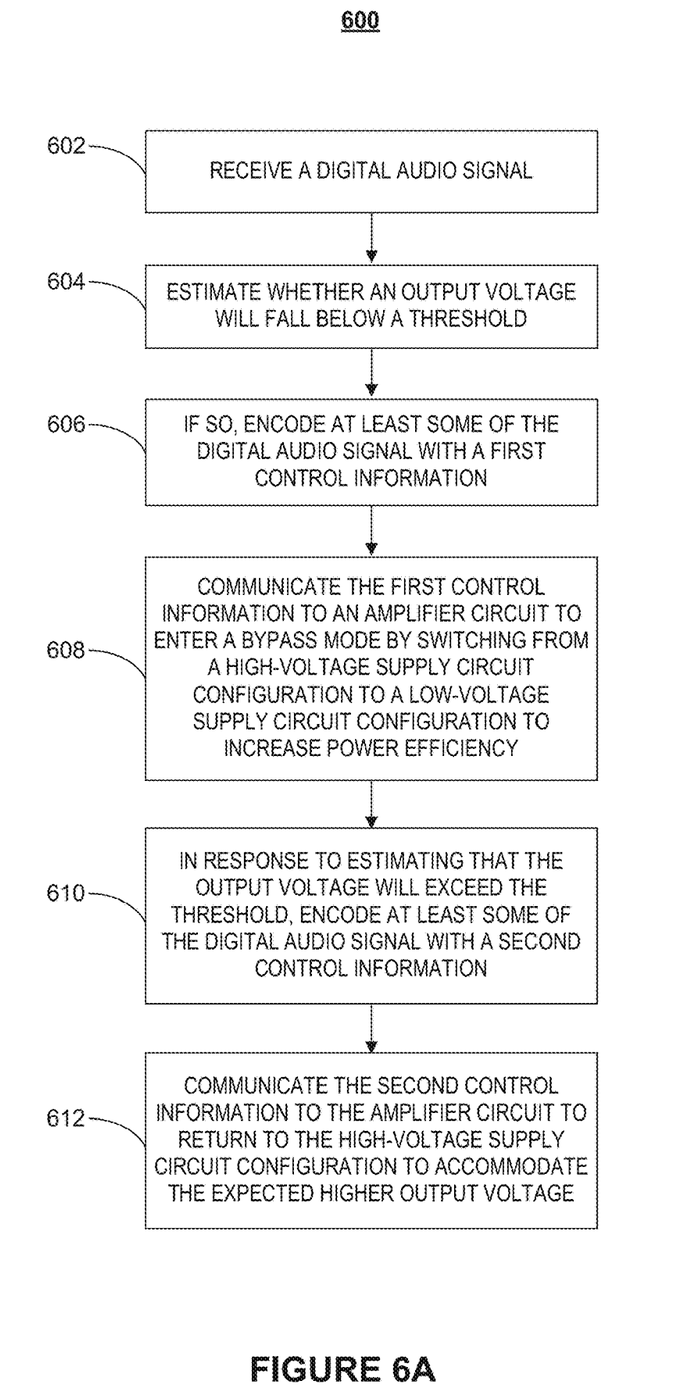
FIGS. 6A and 6B are flowcharts of illustrative processes for dynamic power supply transitions according to various embodiments of the present disclosure.

FIG. 6A is a flowchart of an illustrative process for dynamic power supply transitions according to various embodiments of the present disclosure. In embodiments, process 600 may begin at step 602 when, for example at a host processor that is communicatively coupled to a speaker driver, a digital audio signal is received.

At step 604, the host processor may use an audio controller to estimate whether an output voltage that is associated with the received digital audio signal is likely to exceed a predetermined threshold. If so, at step 606, the host processor may use an encoder circuit to encode at least some of the digital audio signal with some control information representative of the digital audio signal falling below the threshold.

At step 608, the encoder circuit may communicate the control information to a speaker driver that uses an amplifier circuit to, e.g., enter a bypass mode by switching from a high-power supply circuit configuration to a low-power supply circuit configuration to accommodate the expected output voltage and to increase the power efficiency of the amplifier.

Conversely, if the audio controller determines or estimates that the output voltage will exceed the threshold, the encoder circuit may, at step 610, encode at least some of the digital audio signal with control information to instruct the amplifier circuit, at step 612, to return to the high-power circuit configuration to accommodate the expected higher output voltage of the amplifier.

Figure 6B:
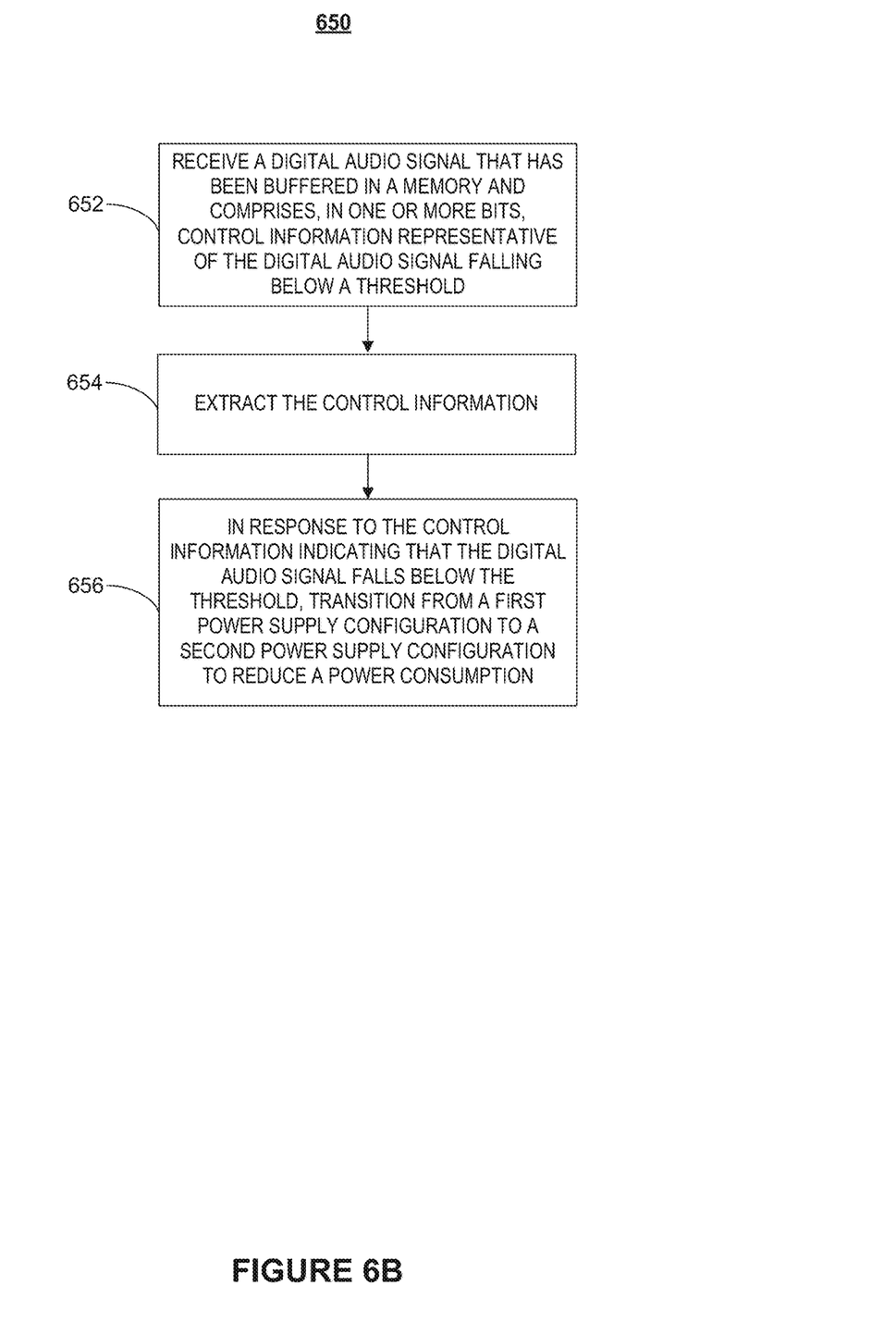

FIG. 6B is a flowchart of another process for dynamic power supply transition according to various embodiments of the present disclosure. In embodiments, process 650 may begin at step 652 when, e.g., at a speaker driver, a digital audio signal is received. The digital audio signal may have been buffered in a memory and comprise, in one or more bits, control information representative of the digital audio signal falling below a threshold.

At step 654, the speaker driver may use a decoder to extract the control information from the digital audio signal.

Finally, at step 656, in response to the control information indicating that the digital audio signal falls below the threshold, to reduce power consumption, the speaker driver may use an amplifier circuit to transition from a first power supply configuration to a second power supply configuration to increase power efficiency of the speaker driver.

Figure 7:
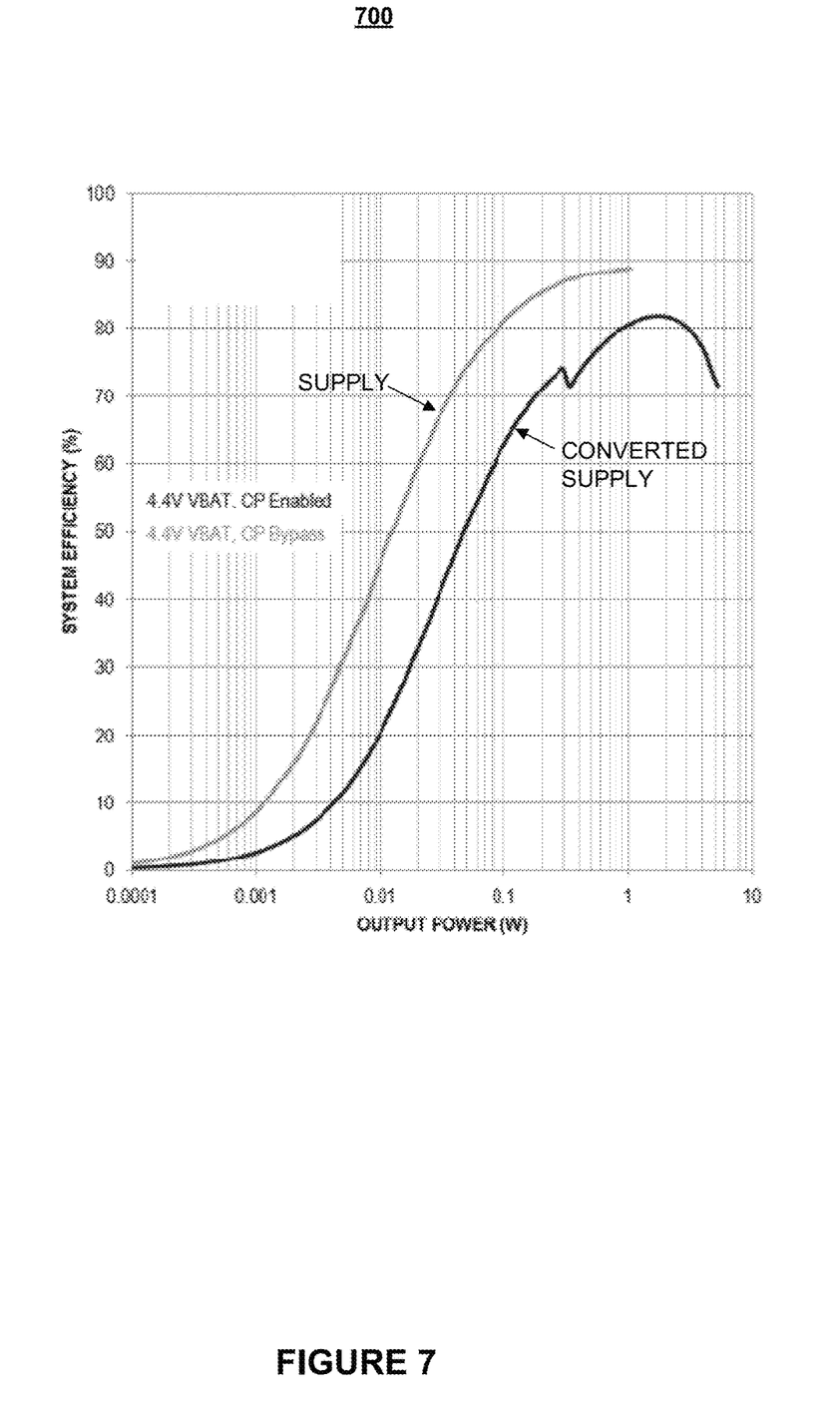
FIG. 7 shows two plots that illustrate how system efficiency depends on output power for different two power supply configurations, according to various embodiments of the present disclosure.

FIG. 7 shows two plots that illustrate how system efficiency depends on output power for different two power supply configurations, according to various embodiments of the present disclosure. It shall be noted that any experiments and results provided herein are provided by way of illustration and were performed under specific conditions using a specific embodiment or embodiments; accordingly, neither these experiments nor their results shall be used to limit the scope of the disclosure of the current patent document.

The plot on the left side in FIG. 7 illustrates the behavior of a low power supply having a 4.4V battery voltage (e.g., supply 1 shown in FIG. 4 in bypass mode), i.e., operating without the aid of a converter circuit. And the plot on the right side is that for a relatively high power supply having a 13.2V battery voltage, i.e., three times higher than that of the low power supply. In embodiments, the high power supply may be a converted power supply that comprises a boost converter that is based on a low power supply, as is oftentimes used in class-H designs, e.g., power supply 1 in combination with the converter circuit (denoted as numeral 424) in FIG. 4.

As may be easily gleaned from FIG. 7, the low power supply exhibits relatively better efficiencies at the lower power range when compared to the high power supply, even if the maximum obtainable power output of the low power supply is limited to about 1 W. Conversely, the high power supply has a relatively high efficiency at power levels between 1 W and about 4.4 W, yet, it has a relatively poorer efficiency at power levels of 1 W and below when compared to the low power supply.

As will be apparent to one of skilled in the art, efficiency gains and other technical benefits may, therefore, be achieved by utilizing a controlled switching mechanism that strategically transitions between the two (or more) power supplies to take advantage of the individual strengths of each power supply, e.g., depending on the operating conditions of a speaker driver circuit.

Figure 8:
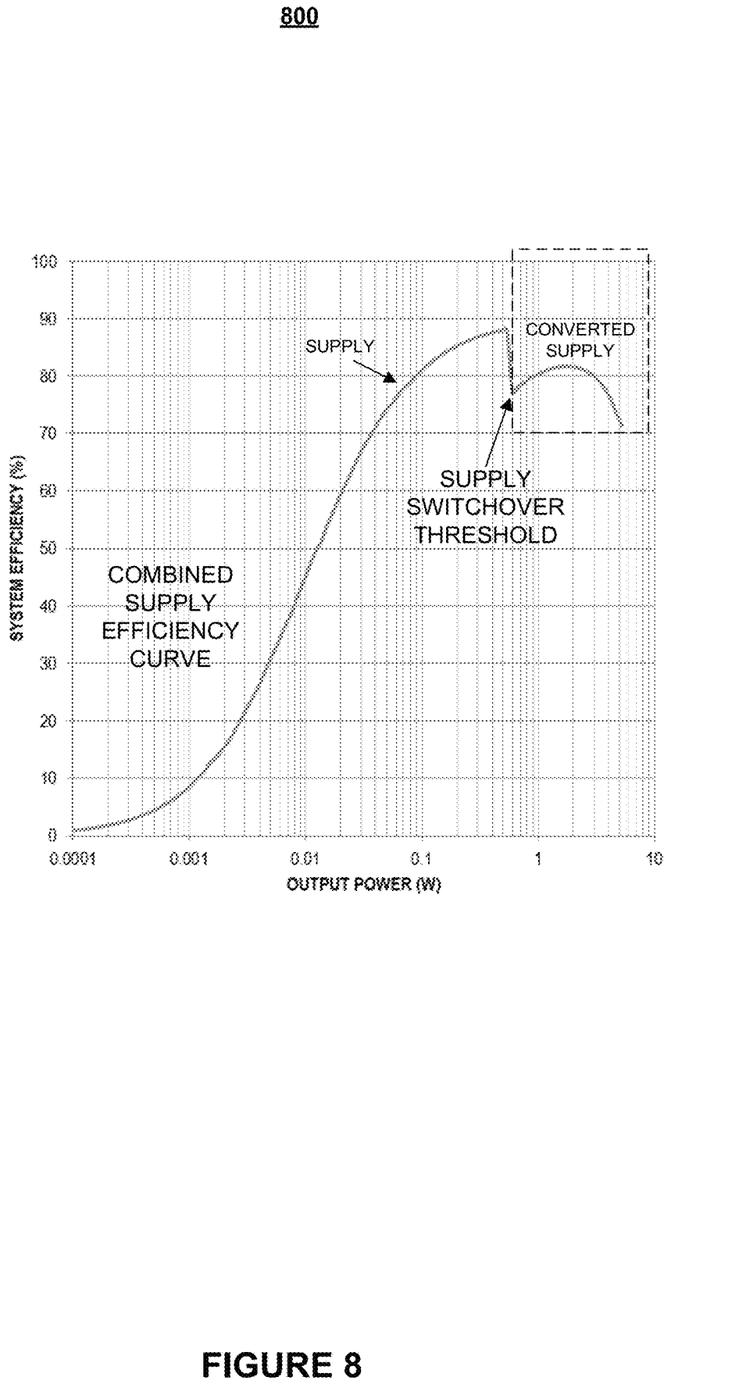
FIG. 8 illustrates a combined supply efficiency curve with a switchover threshold between the two power supply configurations used in FIG. 7.

FIG. 8 illustrates a combined supply efficiency curve with a switchover threshold between the two power supply configurations used in FIG. 7. As shown in FIG. 8, once, for example based on audio signal levels (i.e., output power levels), the highly efficient low power supply approaches its power limit, the audio system may automatically switch operation to the high power supply to extend the power range, advantageously, without the high power supply having to operate within the low-efficiency portion of its output characteristic, thus, greatly increasing overall system efficiency, especially, for low power levels (low audio amplitudes).

Figure 9A:
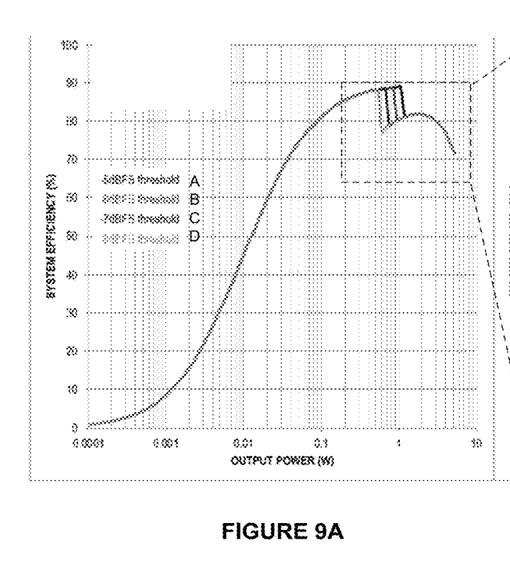
FIG. 9A illustrates combined supply efficiency curves with programmable switchover thresholds according to various embodiments of the present disclosure.
Figure 9B:
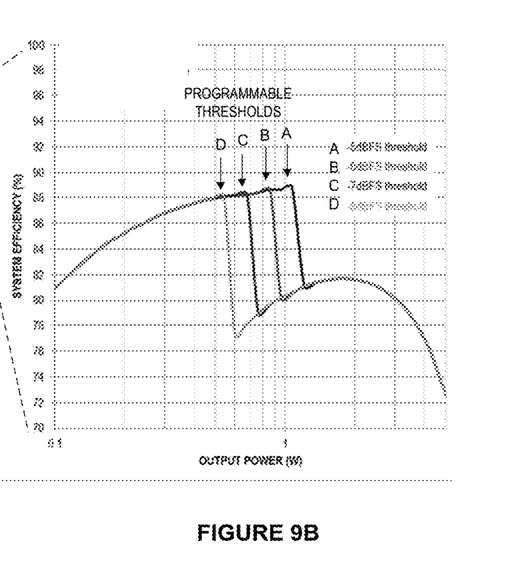
FIG. 9B is an expanded view of the programmable switchover thresholds shown in FIG. 9A.

FIG. 9A illustrates combined supply efficiency curves with programmable switchover thresholds according to according to various embodiments of the present disclosure, with FIG. 9B showing an expanded view of the programmable switchover thresholds shown in FIG. 9A. As previously mentioned, mode transitions from one power supply configuration to another may comprise switching either between two or power supplies or switching configurations of a single power supply.

The exemplary modulations in FIGS. 9A and 9B were implemented in class-H, i.e., one power supply having different power levels was used. In particular, a 4.4V ($V_{BAT}$) and 12V boost were employed. The different programmable thresholds are labeled A through D.

In embodiments, once the signal level at the audio interface drops, the system may dynamically switch, as for example in FIG. 8, to the lower power supply configuration to take advantage of the higher efficiency at the lower power levels. As shown in the combined efficiency curves in FIGS. 9A and 9B, the threshold denoted as "A" (−5 Decibels relative to Full Scale) provides the best efficiency.

Overall, the minimal amount of effort involved in manipulating and communicating an encoded audio signal over a standard audio interface, e.g., independently of vendor and using any type of modulation scheme, to specify in the data plane which supply configuration to use is an elegant solution that improves efficiency and, advantageously, provides great flexibility in audio systems.

Figure 10:
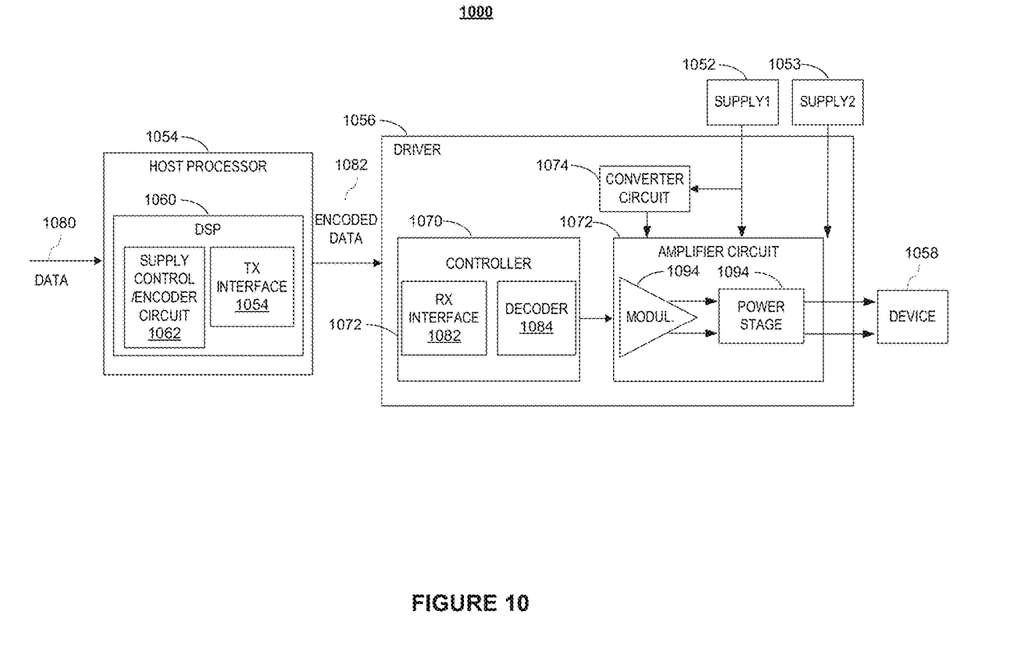
FIG. 10 illustrates a more general signal processing system, according to various embodiments of the present disclosure, than that presented in FIG. 4.

FIG. 10 illustrates a more general signal processing system according to various embodiments of the present disclosure than that presented in FIG. 4. In embodiments, system 1050 may comprise power supplies 1052, 1053, host processor 10510, driver 1056, and device 1058, which may be any arbitrary device. Host processor 1054 may comprise a signal processor, e.g., DSP 1060, which may comprise supply control or encoder circuit 1062 and transmit interface 1064. Driver 1056, which may be implemented as an RF driver, an optical driver, and the like, may comprise controller 1070 that comprises decoder 1084 and receiver interface 1082. Driver 1056 may further comprise converter circuit 1074 and amplifier circuit 1072, which may comprise modulator 1092 and output power stage 1094 that drives device 1058.

It is understood that the teachings of the present disclosure may be applied to any type of amplifier circuit that may utilize information communicated via data 1080 to switch or transition between power supplies, e.g., by switching between different supplies at different times or between different power rails powered by the same supply to choose between two or more output voltage levels. Data signal 1080, e.g., a data stream comprising a modulated power signal, may comprise any content in any type of format generated by any source or device 1058 known in the art. In embodiments, transmit interface 1014 may be any existing digital interface that may transmit data 1080, e.g., in a pre-processed format to controller 1020.

In operation, transmit interface 1014 in host processor 1004 may be used to control and facilitate power supply switchover, as discussed in greater detail next. In embodiments, signal processor 1060 in host processor 1064 may analyze one or more properties or characteristics of signal 1080 and/or its content to estimate or calculate whether a signal, e.g., an output voltage of amplifier circuit 1072 is likely to exceed a predetermined threshold to accommodate the characteristic(s). Signal processor 1060 may apply to data signal 1080 any threshold detection scheme known in the art, e.g., to make a likelihood determination or calculation that may use statistical tools and/or measured data. In embodiments, DSP 1060 may, based on the analysis, encode control information into data 1080 to generate encoded data 1082 that may comprise information indicating that at least some signal may exceed the predetermined threshold.

Once encoded data 1082 has been generated, in embodiments, host processor 1054 may use transmit interface 1064 to communicate encoded data 1082 to controller 1070. In embodiments, upon receiving encoded data 1082 at interface 1082 of controller 1070, controller 1070 may use decoder 1084 to extract the information that has been estimated or calculated by host processor 1054 to generate control information. In embodiments, the control information may be applied, e.g., in a switchover process, to amplifier circuit 1072 to perform a supply selection between supplies 1052, 1053, between various power supply configurations of one of respective supplies 1052 and 1053, or a selection within a single supply couple to different power rail configurations. In embodiments, the switchover process may comprise controller 1070 anticipating, e.g., based on a relatively large buffer, that a threshold may be exceeded, and controlling amplifier circuit 1072 to select a particular power supply configuration that, advantageously, reduces power consumption, for example, until controller 1070 determines that the threshold will no longer be exceeded.

It is noted that, as mentioned with reference to FIG. 3, any power supply 1052, 1053 may comprise a battery and converter circuit 1074 may comprise a boost converter, which may be programmed automatically turn off once the battery is sufficiently charged to be able to directly supply amplifier circuit 1072, further reducing power consumption.

Figure 11:
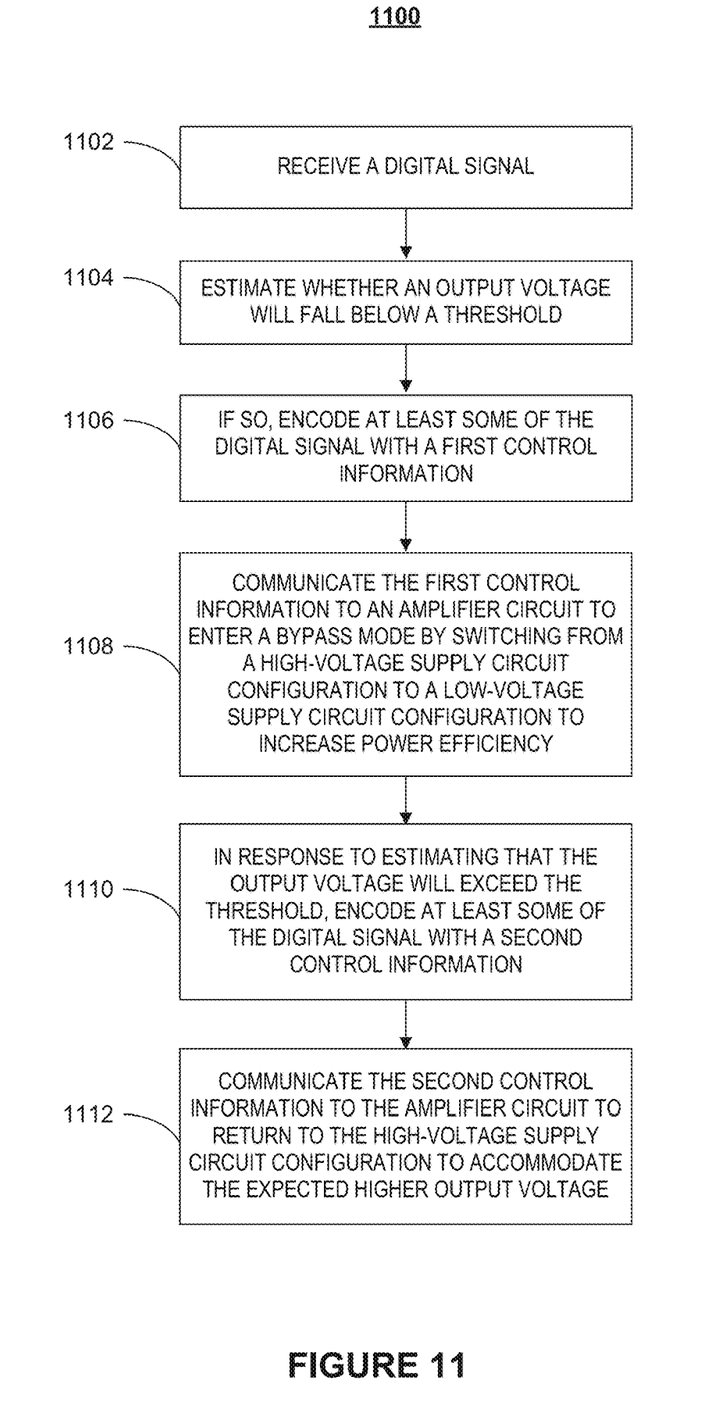
FIG. 11 is a flowchart of an illustrative process for dynamic power supply transition according to various embodiments of the present disclosure.

It is further noted that system 1050 illustrated in FIG. 11 is not limited to the constructional detail shown there or described in the accompanying text. As those skilled in the art will appreciate system 1050 may comprise different and/or additional components, such as memory devices, multiplexers, control logic, e.g., state machines and control signals, e.g., reference signals and clocks, filters, e.g., ripple or EMI filters, compression circuitry, protection circuitry, and other components useful or necessary in accomplishing the objectives of the present disclosure. For example, the outputs of amplifier circuit 1072 may be routed to controller 1070 in a in a feedback loop not shown in FIG. 10. A person of skill in the art will also appreciate that one or more components in FIG. 10 may be integrated into a single device.

FIG. 11 is a flowchart of an illustrative process for dynamic power supply transitions according to various embodiments of the present disclosure. In embodiments, process 1100 may begin at step 1102 when, for example at a host processor that is communicatively coupled to a driver, a digital signal is received.

At step 1104, the host processor may use a controller to estimate whether an output voltage that is associated with the received digital signal is likely to exceed a predetermined threshold. If so, at step 1106, the host processor may use an encoder circuit to encode at least some of the digital signal with some control information representative of the digital signal falling below the threshold.

At step 1108, the encoder circuit may communicate the control information to a speaker driver that uses an amplifier circuit to, e.g., enter a bypass mode by switching from a high-power supply circuit configuration to a low-power supply circuit configuration to accommodate the expected output voltage and to increase the power efficiency of the amplifier.

Conversely, if the controller determines or estimates that the output voltage will exceed the threshold, the encoder circuit may, at step 1110, encode at least some of the digital signal with control information to instruct the amplifier circuit, at step 1112, to return to the high-power circuit configuration to accommodate the expected higher output voltage of the amplifier.

Aspects of the present invention may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using ASIC(s), programmable arrays, digital signal processing circuitry, or the like. Accordingly, the "means" terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present invention may further relate to computer products with a non-transitory, tangible computer-readable medium that have computer code thereon for performing various computer-implemented operations. The media and computer code may be those specially designed and constructed for the purposes of the present invention, or they may be of the kind known or available to those having skill in the relevant arts. Examples of tangible computer-readable media include, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices.

Examples of computer code include machine code, such as produced by a compiler, and files containing higher level code that are executed by a computer using an interpreter. Embodiments of the present invention may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present invention. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A method for increasing power efficiency in communication systems, the method comprising:
   in response to receiving a digital signal that comprises a characteristic, determining whether the characteristic exceeds a threshold corresponding to an increase in a power requirement;
   encoding at least some of the digital signal with control information that indicates that the characteristic exceeds the threshold to obtain an encoded signal;
   communicating the encoded signal to a driver circuit that decodes the encoded signal and uses the decoded signal to cause an amplifier circuit to increase a power output such as to accommodate the increase in the power requirement; and
   in response to determining that the characteristic no longer exceeds the threshold, causing the driver circuit to decrease the power output to conserve energy.

2. The method according to claim 1, wherein the amplifier circuit uses at least one of a high-power circuit configuration or a low-power circuit configuration to drive one or more devices.

3. The method according to claim 2, wherein the driver circuit is a speaker driver, the digital signal is a digital audio signal, and the one or more devices comprise one or more speakers.

4. The method according to claim 1, wherein the amplifier circuit, in a bypass mode, switches from a low-power circuit configuration to a high-circuit configuration to increase power efficiency of a communication system.

5. The method according to claim 1, wherein the control information comprises one or more bits that are generated based on at least one of a circuit gain, a margin requirement, or a headroom requirement.

6. The method according to claim 5, wherein the one or more bits comprise information to turn on or off a power supply.

7. The method according to claim 1, wherein receiving the digital signal comprises at least one of monitoring or buffering the digital signal.

8. The method according to claim 1, further comprising in response to a change in a battery voltage, adjusting the threshold to accommodate a safety margin.

9. The method according to claim 1, wherein the amplifier circuit comprises a programmable boost converter that generates an output voltage that adjusts the power output.

10. A system for increasing power efficiency in communication systems, the system comprising:
    a signal processor that, at an interface, receives a digital signal that comprises a characteristic, the signal processor performing steps comprising:
      determining whether the characteristic exceeds a threshold corresponding to an increase in a power requirement of a device;
      in response to determining that the characteristic no longer exceeds the threshold, causing a driver circuit that is coupled to the signal processor to decrease a power output to conserve energy; and
      encoding at least some of the digital signal with a control information that indicates that the characteristic exceeds the threshold to generate an encoded signal, the driver circuit comprising a controller that, in response to receiving the encoded signal, performs steps comprising:
        extracting the control information; and
        using the control information to generate a control signal; and
    an amplifier circuit coupled to the driver circuit, the amplifier circuit, in response to receiving the control signal increases the power output to accommodate the increase in the power requirement of the device.

11. The system according to claim 10, wherein the amplifier circuit uses at least one of a high-power circuit configuration or a low-power circuit configuration to drive the device.

12. The system according to claim 11, wherein the driver circuit is a speaker driver, the digital signal is a digital audio signal, and the device comprises one or more speakers.

13. The system according to claim 10, wherein the amplifier circuit switches from a low-power circuit configuration to a high-circuit configuration to increase power efficiency of a communication system.

14. The system according to claim 10, wherein the driver circuit comprises an encoder circuit that generates the encoded signal, which comprises one or more bits, based on at least one of a circuit gain, a margin requirement, or a headroom requirement.

15. The system according to claim 14, wherein the one or more bits comprise information to turn on or off a power supply.

16. The system according to claim 10, wherein the signal processor further performs steps comprising monitoring, or buffering the digital signal.

17. The system according to claim 10, wherein the signal processor, in response obtaining information regarding a change in a battery voltage, adjusts the threshold to satisfy a safety margin.

18. The system according to claim 10, wherein the amplifier circuit comprises a programmable boost converter that generates an output voltage that adjusts the power output.

19. The system according to claim 10, wherein the amplifier circuit transitions from a first power supply configuration to a second power supply configuration to reduce a power consumption.

20. The system according to claim 19, wherein the first power supply configuration is associated with a first power supply and the second power supply configuration is associated with a second power supply.

* * * * *